United States Patent [19]

Aihara et al.

[11] Patent Number: 5,282,146
[45] Date of Patent: Jan. 25, 1994

[54] TEST ASSISTANT SYSTEM FOR LOGICAL DESIGN PROCESS

[75] Inventors: Masami Aihara; Masatoshi Sekine; Tsutomu Takei, all of Kanagawa; Hiroaki Nishi, Chiba; Kazuyoshi Kohno, Tokyo; Takeshi Kitahara; Atsushi Masuda, both of Kanagawa, all of Japan

[73] Assignee: Kabushiki Kaisha Toshiba, Kawasaki, Japan

[21] Appl. No.: 694,136

[22] Filed: May 1, 1991

[30] Foreign Application Priority Data

May 2, 1990 [JP] Japan .................................. 2-115071
Feb. 6, 1991 [JP] Japan .................................. 3-015313

[51] Int. Cl.$^5$ .............................................. G06F 15/60
[52] U.S. Cl. .................................. 364/489; 364/488; 364/578
[58] Field of Search ............... 364/489, 488, 578, 580, 364/579; 371/27, 23; 324/158 R; 395/600

[56] References Cited

U.S. PATENT DOCUMENTS

| | | | |
|---|---|---|---|
| 4,293,950 | 10/1981 | Shimizu et al. | 371/27 |
| 4,716,564 | 12/1987 | Hung et al. | 371/27 |
| 4,862,460 | 8/1989 | Yamaguchi | 371/27 |
| 4,901,259 | 2/1990 | Watkins | 364/578 |
| 4,977,531 | 12/1990 | Ogata et al. | 364/580 |
| 4,991,176 | 2/1991 | Dehbura et al. | 371/27 |
| 5,020,009 | 5/1991 | Ogata et al. | 364/580 |
| 5,020,010 | 5/1991 | Ogata et al. | 364/580 |
| 5,053,981 | 10/1991 | Ogata et al. | 371/27 |
| 5,084,824 | 1/1992 | Lam et al. | 364/490 |
| 5,097,422 | 3/1992 | Corbin, II et al. | 364/491 |

Primary Examiner—Vincent N. Trans
Attorney, Agent, or Firm—Oblon, Spivak, McClelland, Maier & Neustadt

[57] ABSTRACT

Disclosed is a test assistant system for a logical design process comprising a description storage data base for storing statements expressing logical functions of circuit components to be tested, a compiler for compiling the statements to output object data, a data base for storing the object data, a test pattern generator for generating test patterns by using the object data stored in the data base, a test pattern data base for storing the test patterns, each having a level number, a simulator for executing a simulation for the logical function by using the test patterns stored in the test pattern data base, and a display for displaying the object data, the test patterns, the information used in the simulation, and relationships among them. The data base comprises a region for storing a statement correspondence table expressing statements as descriptions of the logical functions of the circuit components, a region for storing a circuit component table expressing a circuit component corresponding to the function described in the statement, a region for storing a dependent relationship table expressing the dependent relationship between the statements, and a correspondence relationship table expressing the correspondence relationship between the statement correspondence table and the circuit component table.

5 Claims, 13 Drawing Sheets

| STEP | STATEMENT NUMBERS TO BE VERIFIED | |
|---|---|---|
| | PRESENT INVENTION | PRIOR ART |
| STEP 1 | STATEMENT 141 | STATEMENTS 141,142 |
| STEP 2 | STATEMENT 142 | STATEMENTS 142,143 |
| STEP 3 | STATEMENT 143 | STATEMENTS 143,144 |
| STEP 4 | STATEMENT 144 | STATEMENT 144 |

51a~51c : STATEMENT CORRESPONDENCE TABLES

53 : CIRCUIT COMPONENT TABLE

55 : DEPENDENT RELATIONSHIP TABLE

57 : RIGHT EXPRESSION TABLE 59a,59b : RIGHT CORRESPONDENCE TABLES

59c : LEFT CORRESPONDENCE TABLE

FIG.7A
IF A THEN
B=C AT CLK ;
ENDIF ;
FIG.7B
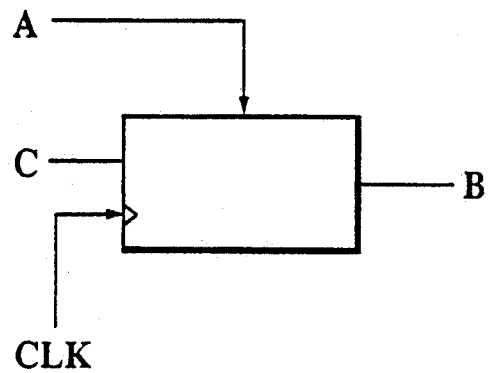
FIG.8A
STT1 : IF A THEN
         NEXT STT2 ;
      ELSE
         NEXT STT3 ;
      ENDIF
STT2 : NEST STT1 ;
STT3 : NEXT STT2 ;
FIG.8B
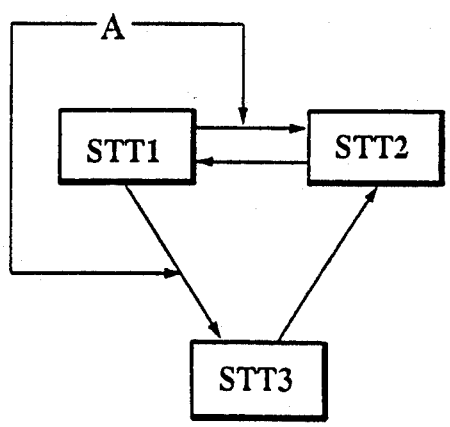

| FIG.10A |
| FIG.10B |

TEST ASSISTANT SYSTEM FOR LOGICAL DESIGN PROCESS

BACKGROUND OF THE INVENTION

1. Field of the Invention

This invention relates to a test assistant system for a logic design process, which is capable of automatically executing a test pattern generating operation and a functional simulation required for a logic design of a logic circuit system.

2. Description of the Prior Art

A test pattern generating operation for generating test patterns must be required to evaluate logic circuits designed by a designer.

There is a method to design a logic circuit, by which existing logic gates which are stored in a gate cell library are combined to generate the logic circuit. There are two methods used for a combinational circuit and for a sequential circuit, for a test pattern generating method for the logic circuit designed by using the method.

There are the D-algorithm, the ENF method, Poage's method, the boolean differential method, the random testing generating method, and the PODEM method as test input generating methods used for the combinational circuit.

In addition, there are Poage's method, the random testing method, and the compact testing method as test generation methods used for the sequential circuit.

In these test pattern generating methods used for the logic gates such as the combinational circuit and the sequential circuit, test patterns for all events are generated by the methods at the same time since testing data cannot be distinguished from a control signal.

Accordingly, an enormous number of test patterns are generated for a large integrated circuit, for example, including more than 50K gates, by the test pattern generating methods described above.

Namely, these test pattern generating methods should be used for the logic circuits including less than 10 k gates.

On the other hand, there are design methods which use a hardware descriptional language (HDL) of the register transfer (RT) level to describe various logical functions. The logical gates are interconnected by using descriptions (statements) in the hardware descriptional language.

Test patterns for testing the logical functions of a logical circuit obtained by using the method are provided from a functional design data base comprising the descriptions for the logical functions.

The RT-level hardware descriptional language can mainly generate test patterns for data transfers between registers.

The test pattern generating method based on the RT-level language have been reported in the following literature.

T.LIN & S.Y.H.SU, The S-algorithm, "A promising Solution for Systematic Functional Test Generation", IEEE TRANS. on COMPUTER-AIDED DESIGN, VOL. CAD-4. No. 3, July 1985".

The functional design data base for logical design comprises a statement correspondence table in which the statements expressing the logical functions of the logical circuits are included, a circuit component table for expressing logical circuit components of the functions corresponding to the statements, and a dependent relationship table for expressing relationships between the statements.

When test patterns for logical circuits are therefore generated by a generator, the test patterns must be generated in consideration of all information of signals operated in the logical circuits because the kinds of signals handled in the statements cannot be distinguished from one another.

Namely, it takes much time to generate the test patterns in the prior art.

A simulator which uses the test patterns generated by the test pattern generator is also important for the logical design.

There are the level sort method and the event driven method as simulations for a logical system. These are well known in the prior art.

In the level sort method, the level (the level number) of each component in a logical circuit is determined in accordance with the number of steps observed from an input terminal of the logical circuit.

The order of evaluation of each component (for example, an AND gate, an OR, gate and the like as the logical components in the logical circuit) is determined based on the level numbers, then all logical components in the logical circuit are evaluated each time an input vector is provided as a test pattern at one cycle time in the logical circuit.

In general, the level sort method is used by using a compile method in which statements written with a general purpose language or described for the hardware description are translated to sequential machine codes by a compiler. Accordingly, the simulation can be carried out efficiently because control of events that mean changes of signals is not necessary in the level sort method.

However, since it is difficult for the level sort method to handle on asynchronous circuit, the level sort method can handle only a simple combinational circuit and a synchronous circuit.

On the other hand, in the event driven method, only a component in which input level provided from other components is changed is evaluated while transferring the changed input level.

An asynchronous circuit can be easily handled by the event driven method. Moreover, timing analysis of the component can be treated easily by the event driven method. However, the event driven method takes much time because it is frequently executed by using an interpreter method. An evaluation time and an over head as a control time for a circuit operation in the event driven method takes longer than that of the level sort method.

Moreover, in the event driven method, evaluation of not use is yielded by the differences of the number of the levels from the input terminal to each component in the logic circuit.

A simulator based on the event driven method in the prior art is described with reference to FIGS. 1 to 3.

The simulator 130 comprises a functional design data base 131, an event buffer 132, an event evaluation portion 133, and an event registration portion 134.

FIG. 2 is an example of the hardware description for a logical component. In the same diagram, the hardware description 140 describes input terminals A, B, C, and D, output terminal Z, internal signals S1, S2, and S3, and statements 141 (S1=A and B), 142 (S2=S1 and C), 143 (S3=S2 and D), and 144(Z=S3).

There are a data transfer statement, a condition statement and the like as kinds of statements in the hardware description.

As shown in FIG. 3, when the high level ("1") is provided to the input terminals A, B, and D and the low level ("0") is provided to the input terminal C, then the low level is provided to the terminal A and the high level is supplied to the terminal C as a test pattern at the timing T1 so that the events of the terminals A and C are generated. The event information of the terminals A and C is stored in the event buffer 132.

In the event evaluation portion 133, this event information from the terminals A and C is read out to evaluate the statements 141 and 142. In this case, as the events occur in the internal signals S1 and S2, they are stored in the event buffer 132 by the event registration portion 134.

Next, the statements 142 and 143 are evaluated by using the events of the internal signals S1 and S2 and which are stored in the event buffer 132, then the events of the internal signals S2 and S3 are stored in the event buffer 132 by the event registration portion 134.

Similarly, the statements 143 and 144 are evaluated by the events of the signals S2 and S3, then the events of the internal signal S3 and the output terminal Z are registered in the event buffer 132.

Finally, the statement 144 is evaluated by the event of the signal S3 to register the event of the output terminal Z.

Then, when there is no statement evaluated by the event of output terminal Z, the simulation for one vector at the timing T1 is completed.

As clearly described above, the simulator 130 evaluates these statements of 142 to 144 twice.

To summarize the problems in the prior art, a great number of the data paths (chains) are generated for an actual complicated logical circuit in the conventional test pattern generating method of the register transfer (RT) level.

Accordingly, it is possible to use the conventional test pattern genarating methods only for a simple logical circuit other than complicated large integrated logical circuits.

In addition, it is impossible for the simulator based on the level sort method to handle an asynchronous circuit, evaluation of not use occurs in the event driven method.

SUMMARY OF THE INVENTION

This invention is provided to overcome these problems in the prior art.

An object of the present invention is to provide a test assistant system for a logical design process, comprising
description storage means for storing statements expressing logical functions of circuit components to be tested,
a compiler for compiling the statements to output object data,
a data base for storing the object data,
test pattern generating means for generating test patterns by using the object data stored in the data base,
test pattern storage means for storing the test patterns,
a simulator for executing a simulation for the logical function by using the test patterns stored in the test pattern storage means, and
a display means for displaying the object data, the test patterns, the information used in the simulation, and the relationships among them.

Moreover, the data base comprises
a region for storing a statement correspondence table expressing statements as descriptions of the logical functions of the circuit components,
a region for storing a circuit component table expressing a circuit component corresponding to the function described in the statement,
a region for storing a dependent relationship table expressing the dependent relationship between the statements, and
a correspondence relationship table expressing the correspondence relationship between the statement correspondence table and the circuit component table, wherein the statement correspondence table includes an attribute expressing kinds of descriptions,
the correspondence relationship table comprises a right correspondence table which expresses the content of the right portion of the statement.
a right correspondence relationship table expressing the relationship between the right circuit components corresponding to the contents of the right portion of the statement and the right correspondence table.
a left correspondence table which expresses the content of the left portion of the statement, and
a left correspondence relationship table expressing the relationship between the left circuit components corresponding to the contents of the left portion of the statement and the left correspondence table.

Moreover, the statement correspondence table includes a timing attribute when the kind of statement expresses a timing,
a data attribute when the kind of statement expresses a data transfer statement,
a condition (COND) attribute when the kind of statement expresses a condition, and
a status attribute when the kind of statement expresses a state transition.

Furthermore, the test pattern generating means generates test patterns for the attribute of a logical function of each circuit component by using
the statement correspondence table,
the circuit component table,
the dependent relationship table,
the attribute in the statement correspondence table,
the right expressing table and the right correspondence relationship table, and
the left expressing table and the left correspondence table.

Furthermore, when the simulator simulates the functional operations of the logical system modeled by using the descriptions as the hardware description language,
a level number adding means for adding a level number corresponding to the step observed from the input terminal of the logical system to the statement,
a statement extracting means for extracting the statement to be executed in accordance with the change of the test pattern provided in the input terminal,
a extracted statement storage means for storing the statement extracted by the statement extracting means,
a statement evaluating means for extracting the statement having the smallest level number in the extracted statement storage means, then evaluating it, and
a statement adding means for adding a statement to be newly executed by the change of the test pattern occurring after the evaluation of the statement by the statement evaluating means.

These and other objects, features and advantages of the present invention will be more apparent from the following description of a preferred embodiment, taken in conjunction with the accompanying drawings.

BRIEF DESCRIPTION OF THE DRAWINGS

FIGS. 7A and 7B circuit diagrams showing a statement and a function thereof in a register transfer (RT) level;

FIGS. 8A and 8B state diagrams expressing a statement and a function thereof which differs from the statement shown in FIG. 7;

DETAILED DESCRIPTION OF THE EMBODIMENTS

The preferred embodiments will be explained with reference to the drawings.

Figure 5:
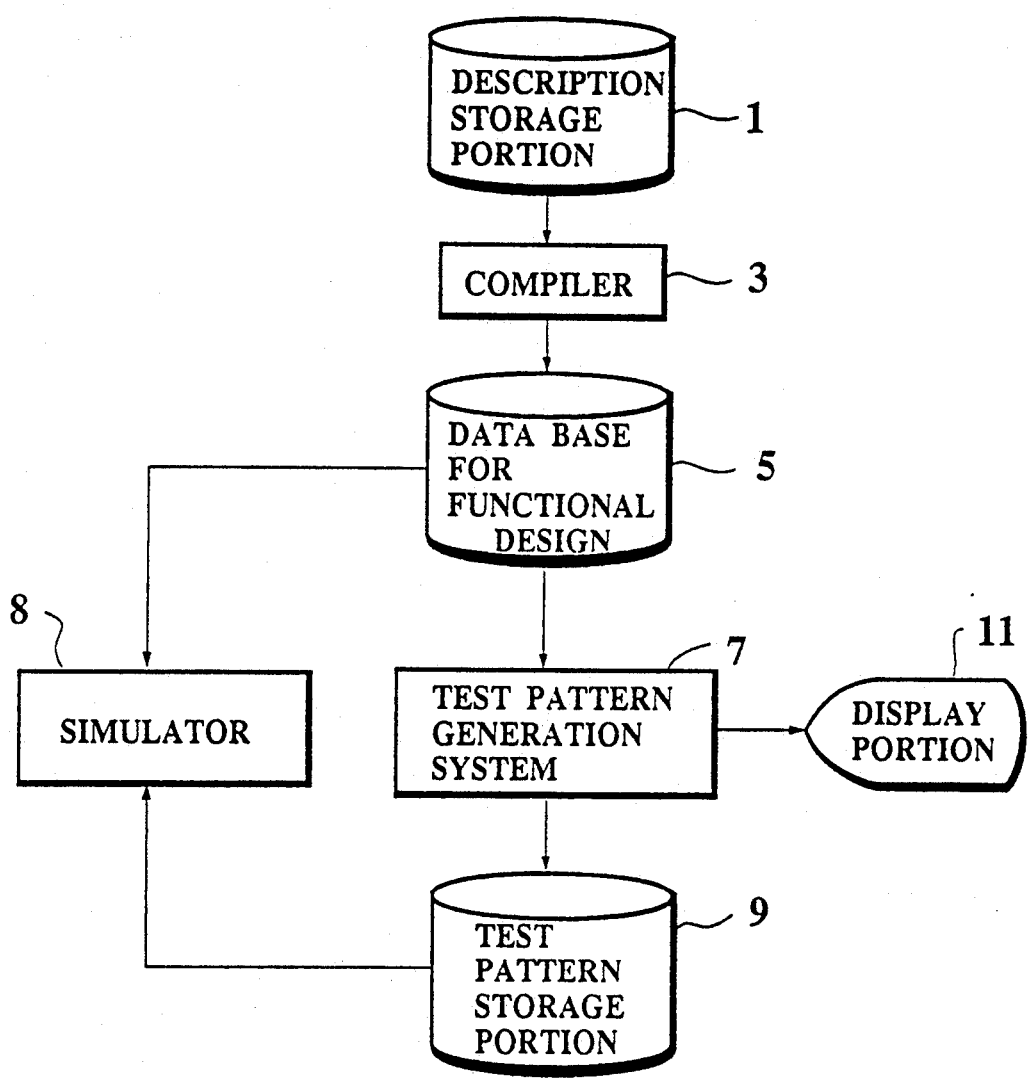
FIG. 5 is a complete block diagram of a test assistant system for a logical design process.

FIG. 5 is a complete block diagram showing a test assistant system for a logical design process according to the present invention.

In the same diagram, statements of a resister transfer (RT) level expressing desired logical functions are stored in a description storage portion 1 as a data base.

The statements stored in the description storage portion 1 are complied to object datas (codes) which are then stored in a functional design data base 5.

The functional design data base 5 comprises various kinds of tables generated by the statements, which is the center portion in a test pattern generating operation.

The tables stored in the functional design data base 5 will be explained in more detail below.

A test pattern generating system 7 generates test patterns by using the functional design data base 5. A test pattern storage portion 9 stores the test patterns generated by the test pattern generating system 7.

A simulator 8 executes a simulation by using the data in the functional design data base 5 and a test pattern in the test pattern storage portion 9.

A display portion 11 displays the data extracted from the functional design data base 5 to a designer during the test pattern generating operation.

Next, a test pattern generation method by using the test assistant system for logical design process according to the present invention will be described.

Figure 6:
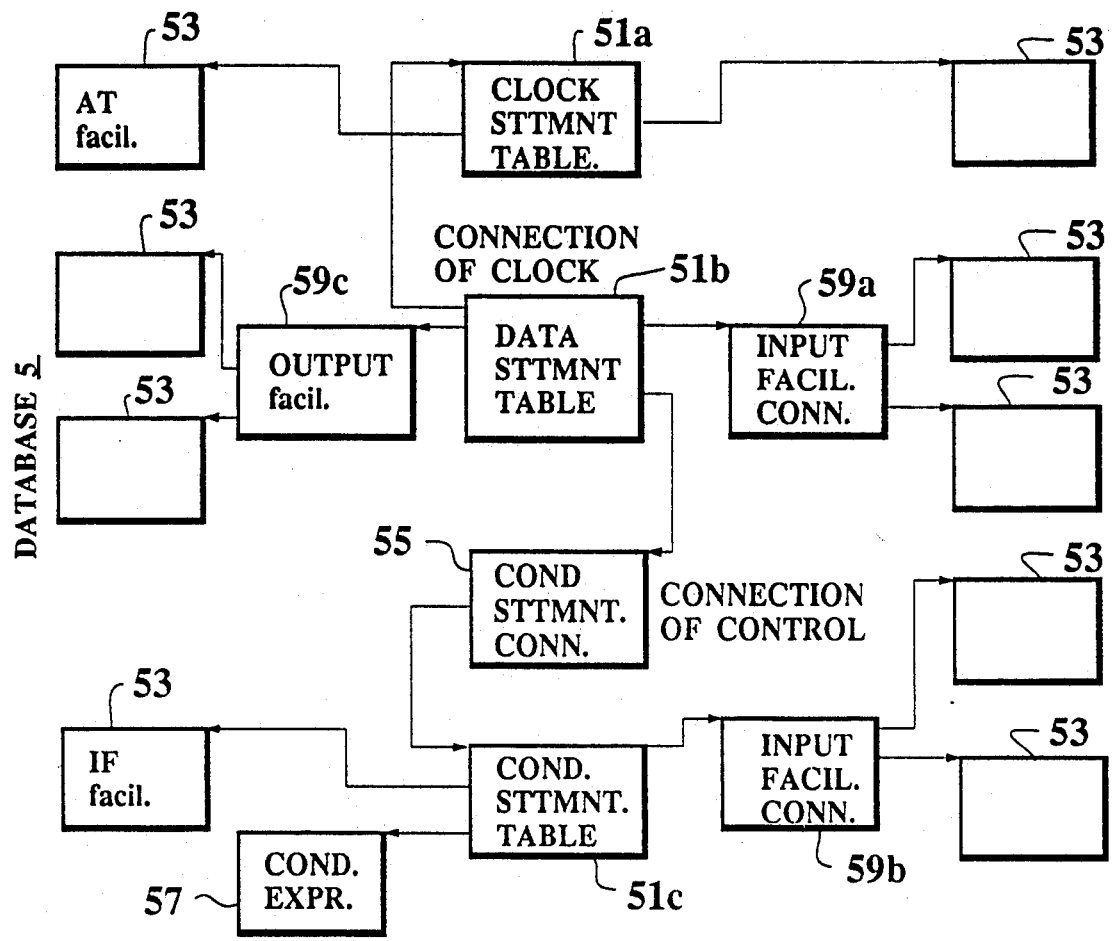
FIG. 6 is a block diagram of a functional design data base.

FIG. 6 is a block diagram of a configuration of the functional design data base 5.

The functional design data base as shown in FIG. 6 comprises statement correspondence tables 51a to 51c, a circuit component table 53, a dependent relationship table 55, a right expression table 57, right correspondence relationship tables 59a and 59b, and a left correspondence relationship table 59c.

The statement correspondence tables 51a to 51c express statements of the RT level, each of which is in accordance with each statement. Each statement correspondence table includes the attribute corresponding to the kind of statement.

For example, each statement correspondence table includes a clock attribute as a timing attribute for the table 51a expressing a timing statement, a data attribute for the table 51b expressing a data transfer statement, a condition (COND) attribute for the table 51c expressing an IF statement. In addition, a status attribute for the table (not shown) for the table expressing a state transition statement.

The circuit component table 53 expresses components such as an external terminal, a register, an internal terminal and the like which are described in the statement.

The dependent relationship table 55 expresses a dependent relationship between statements such as a data transfer statement with a condition, a compound statement, condition statements nesting and the like.

The right expression table 57 expresses a right portion of a statement.

The right correspondence tables 59a and 59b express the relationship between the circuit components of the right portion of the statement and the statement correspondence tables 51a to 51c.

For example, each of the right corresponding relationship tables 59a and 59b corresponds to circuit component 53 in the same diagram.

In the same manner as the right correspondence relationship tables 59a and 59b, the left correspondence table 59c expresses a correspondence relationship between the circuit components described in the left portion of the statement and the statement correspondence table 51b.

The functional design data base 5 has the configuration described above.

Next, the RT level statement and the actual functional design data base 5 based on the statement will be explained.

FIG. 7A is an example of statements expressing a logical circuit, and FIG. 7B is the circuit diagram corresponding to the statements.

The statements in these diagrams mean that the content of C are provided to B in accordance with a clock signal CLK when a control signal A is true.

Each of "IF A", "B=C", and "AT CLK" indicates a statement in FIG. 7A. The statement "B=C" is a data transfer statement using "=". The statement "IF A" is a condition statement in which the condition of the control signal A is defined by "IF".

FIG. 8A is an example of other statements. FIG. 8B is a state transition diagram corresponding to the statements.

The statements shown in FIG. 8A express state transitions. The first state is a state STT1. The statements mean that the first state changes to a state STT2 when the control signal A satisfies the conditions, it changes to the state STT3 when the conditions are not satisfied, and the state STT2 changes to a state STT1 after which the state STT3 changes to the state STT2.

In the statements, each of the phrases "NEXT STT2", "NEXT STT3", and "NEXT STT1" means one statement and each of the phrases "STT2", "STT3", and "STT1" means the right portion of the statement.

The colons ":" mean each state, the state transition is expressed by the "NEXT".

The statements are stored in the description storage portion 1 to compile the statements to generate object data by the compiler 3, in which syntax and grammatical errors included in the statements are checked and detected, then the resultant correct object data is stored in the functional design data base 5.

Figure 9:
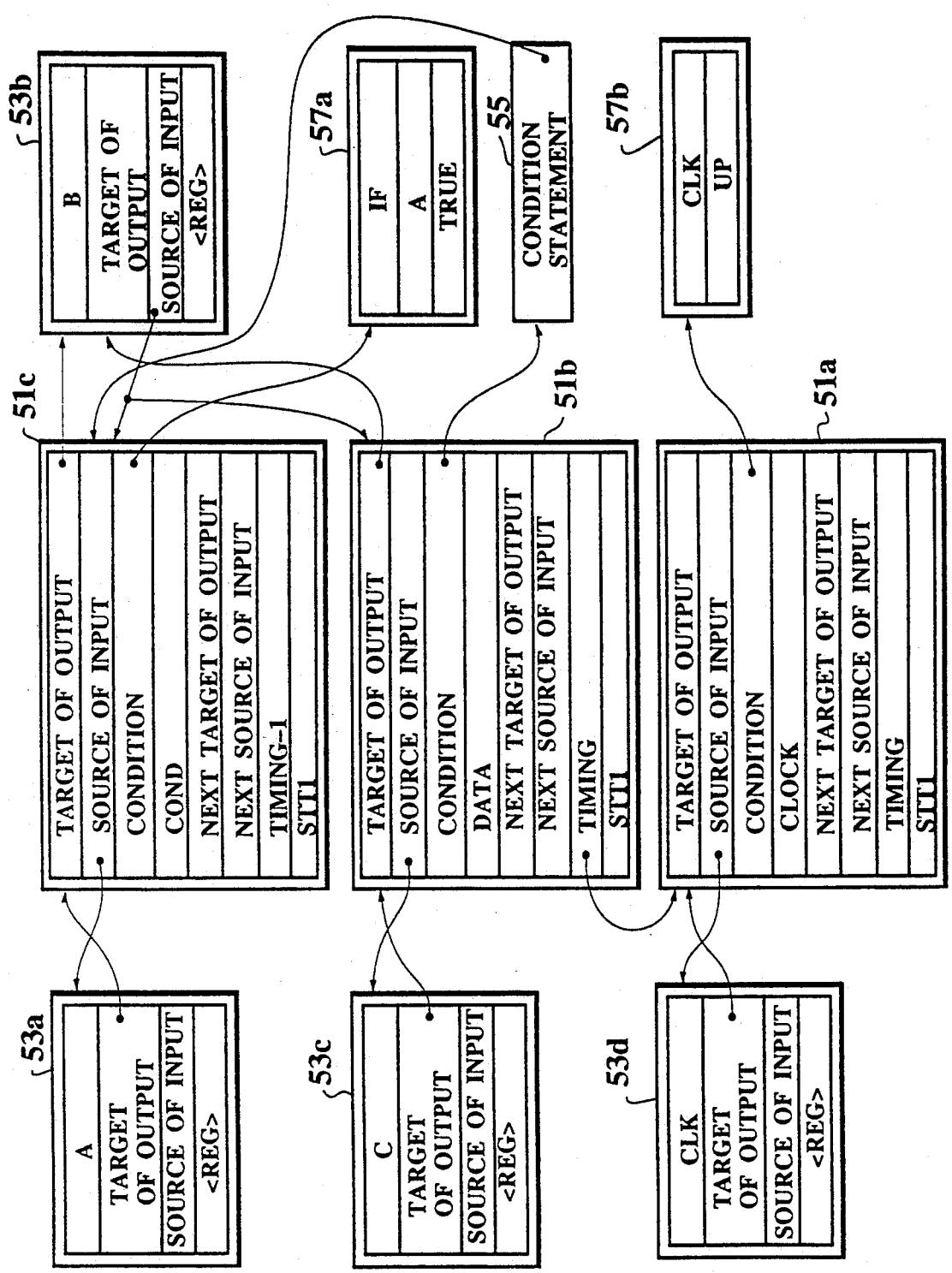
FIG. 9 is a block diagram of a functional design data base in which the statements shown in FIG. 7 are stored.
Figures 10, 10A:
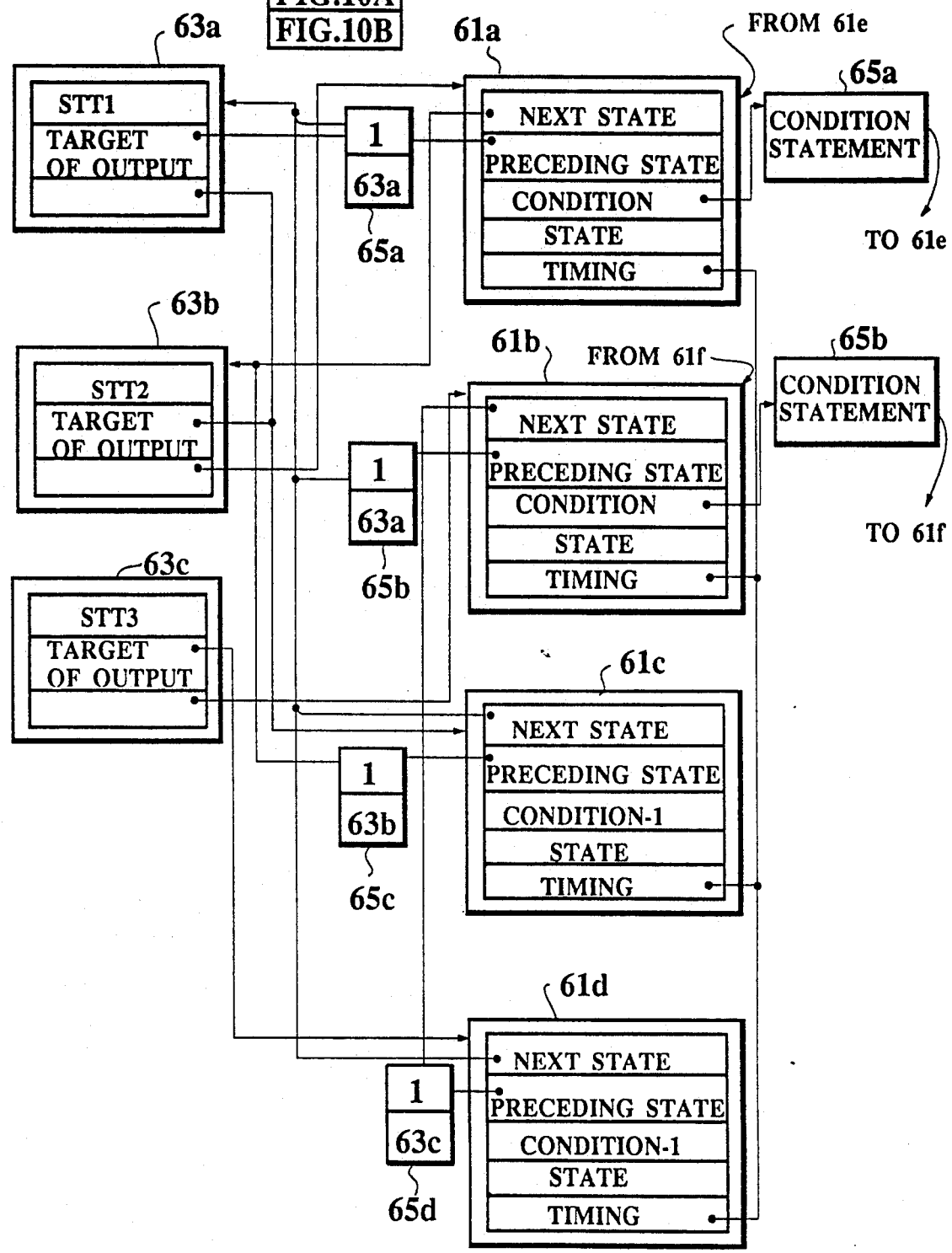
FIGS. 10A and 10B block diagrams of a functional data base in which the statements shown in FIG. 8 are stored.
Figure 10B:
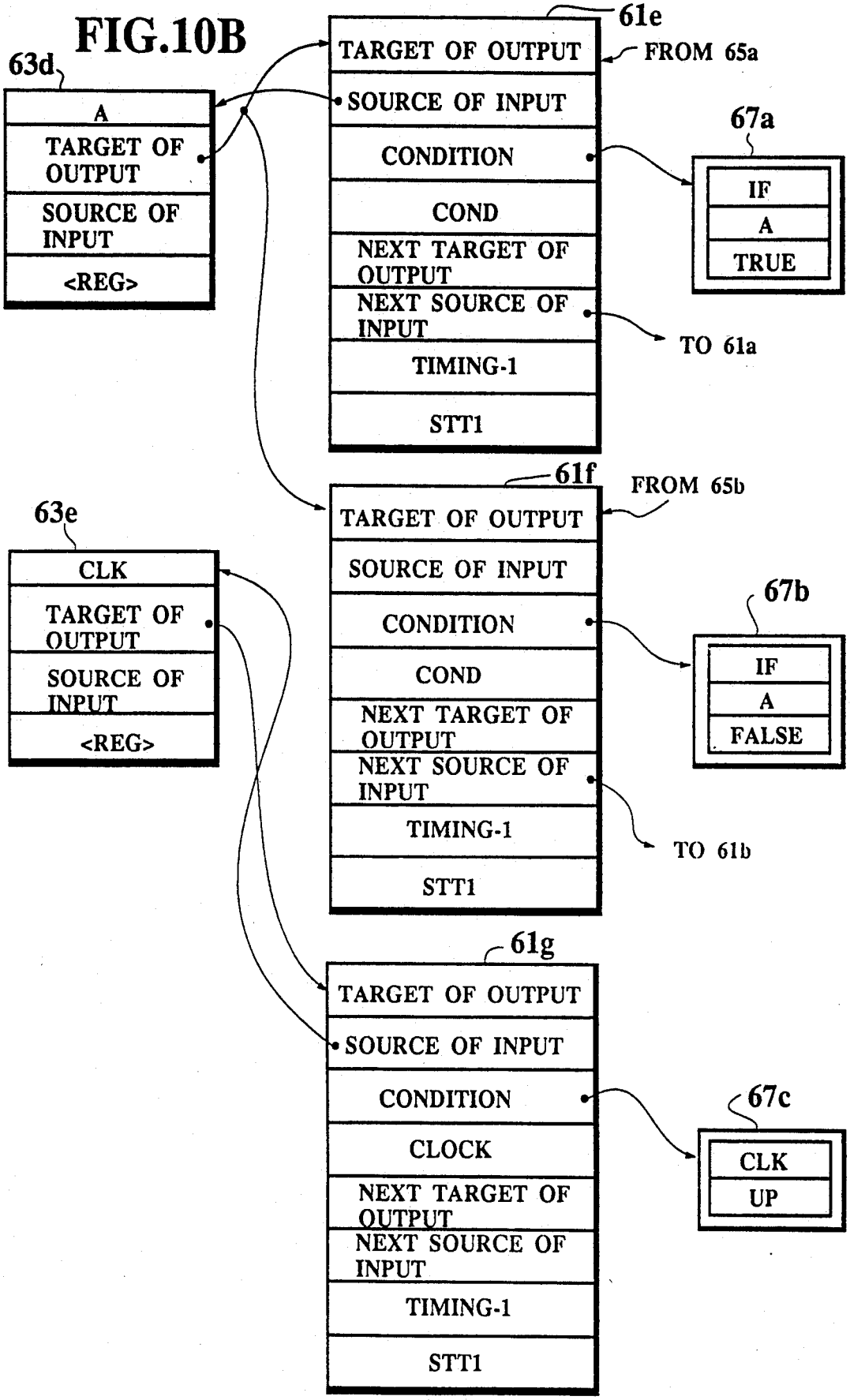

FIGS. 9 and 10 are the contents of the data base 5 generated from the statements shown in FIGS. 7A, 7B, 8A, and 8B.

The functional design data base 5 as shown in FIG. 9 comprises statement correspondence tables 51a to 51c and circuit component tables 53a to 53d, the dependent relationship table 55, and the right expression table 57a and 57b.

The statement correspondence tables 51a and 51c are added with a clock attribute and a data attribute.

The circuit component tables 53a to 53d indicate registers (RGS) as circuit components.

The right expression table 57a shows that the condition of the statement is satisfied when the "A" is true, and the right expression table 57b means that input is provided to the circuit when the clock signal CLK rises.

In the functional data base 5, the sources of input of the circuit component tables 53a and the statement correspondence table 51c are the statement correspondence table 51c and the circuit component table 53b, respectively.

In addition, the targets of output of the circuit component table 53a and the statement correspondence table 51e are the statement correspondence table 51c and the circuit component table 53b, respectively.

Similarly, the statement correspondence tables 51a and 51b are related to the circuit component tables 53b, 53c, and 53d by input/output operations.

The statement correspondence table 51c corresponds to the statement correspondence table 51b as a condition thereof through the dependent relationship table 55, the right expression table 57a corresponds to the statement correspondence table 51c as a condition thereof, and the right expression table 57b corresponds to the statement correspondence table 51a as a condition thereof.

The statement correspondence table 51b is designated as the source of next input in the statement correspondence table 51c when the condition in the right expression table 57a is satisfied.

Namely, the content of "C" is transferred to "B" when the condition of "A" is satisfied.

The functional design data base 5 as shown in FIG. 10 comprises statement correspondence tables 61a to 61g, circuit component tables 63a to 63e, right correspondence relationship tables 65a to 65d, dependent relationship tables 55a and 55b, and right expression tables 57a to 57c.

The statement correspondence tables 61a to 61d include the status attributes STATE, each of which expresses state transition statements "NEXT", "STT1 to STT3" as shown in FIG. 8A.

Each of the circuit component tables 63a to 63c indicates a circuit component corresponding to the state of the statement.

In addition, each of the right correspondence relationship tables 65a to 65d expresses the number of the connections in which the statement correspondence tables 61a to 61d are connected to the right component tables 63a to 63c and the names of the circuit component tables 63a to 63c.

The statement correspondence tables 61e to 61g, the circuit component tables 63d and 63e, the dependent relationship tables 55a and 55b, the right expression tables 57a to 57c have the same inter relationship as shown in FIG. 9.

Parts of the correspondence relationship between the tables in the functional design data base 5 will be explained.

For example, the last state of the statement correspondence table 61a is the state STT1, the next state thereof is the state STT2.

The condition to change to the state STT2 is that "A" be true.

The condition for the statement correspondence table 61b to change to the state STT3 is that "A" be false (FALSE).

Moreover, the right correspondence table 65d indicates that there is one circuit component table, which is the circuit component table 63c.

As clearly shown in FIGS. 9 and 10, the functional design data base 5 has a data structure in which the data can be fetched bi-directionally to generate test patterns.

The functional design data base 5 has the configuration as described above.

The test pattern are generated by using the functional design data base 5 under the control of the test pattern generating system 7.

Figure 11:
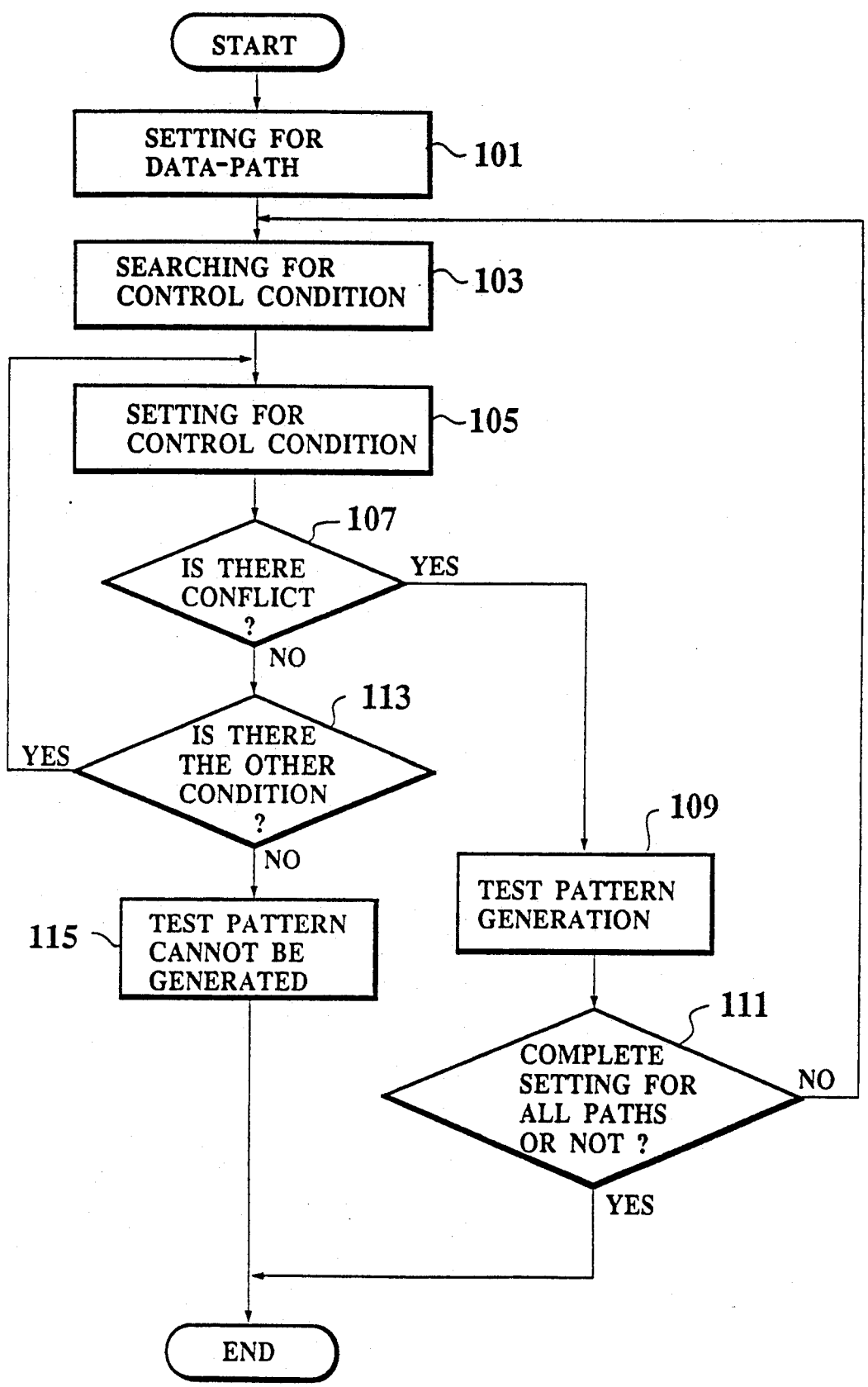
FIG. 11 is a flow chart showing a processing flow of the test pattern generating system as shown in FIG. 5.

FIG. 11 is a flow chart showing the flow of the test pattern generating system 7.

First, a data path as a main flow of data in a logical circuit is specified with reference to the data shown in a display portion 11.

The data extracted from the functional design data base 5 is displayed in the display portion 11 (STEP 101).

Thereby, control conditions to connect the specified data paths are retrieved, then set (STEPS 103 to 105).

At this time, there is a contradiction between the conditions.

For example, where one portion is given a condition that the data paths are connected when the control signal "A" is zero (0), the other portion is given a condition that they are connected when the control signal "A" is one (1).

To overcome the contradiction, the check operation for the conditions is executed (STEP 107).

The test pattern generating operation is carried out when there is no contradiction between the conditions (STEP 109).

The test pattern generating operation is completed for one data path, then another data path is specified to execute the test pattern generating operation (STEPs 101 to 111). The test pattern generating operation is repeated for all paths.

On the other hand, if there is a contradiction between the conditions, difference conditions are newly set to detect whether or not there is a contradiction between the new conditions (STEP 113).

In this case, these control conditions are set when there is no contradiction between them (STEP 105).

However, if it is impossible to reset the conditions, the test pattern generating operation is finished (STEP 115).

Figure 12:
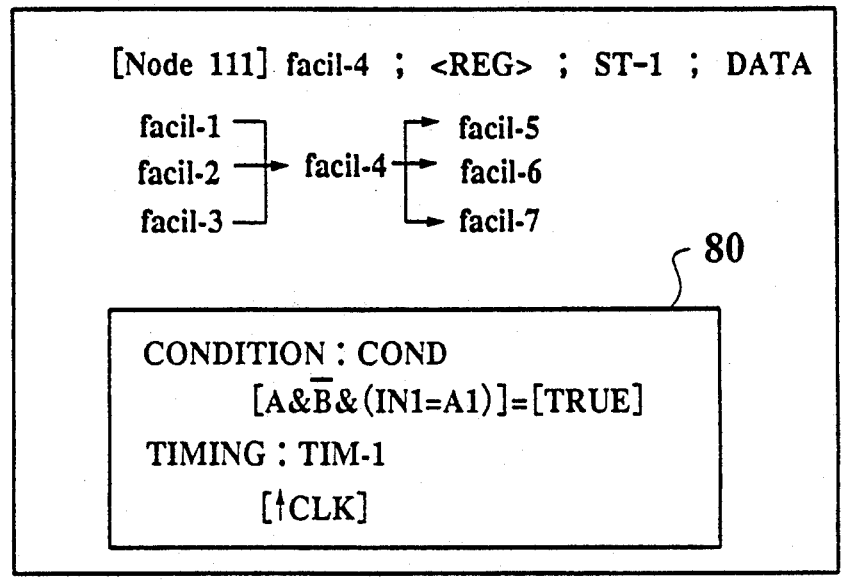
FIG. 12 is a diagram showing data extracted from the functional design data base.
Figure 13:
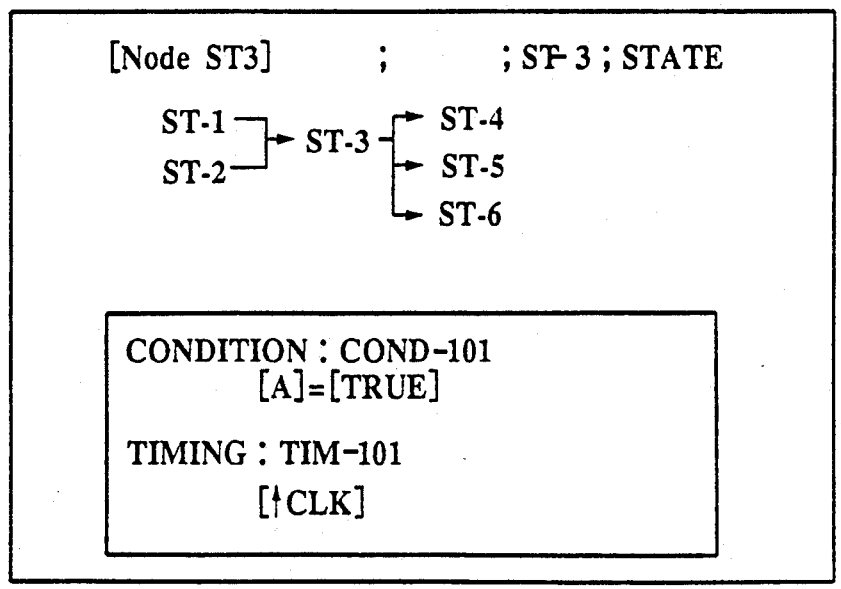
FIG. 13 is a diagram showing other data extracted from the functional design data base.

FIGS. 12 and 13 are examples in which data is displayed on the display portion 11 when the data paths are specified.

The data shown in FIG. 12 is used when the test patterns are generated by using the statement correspondence table 51b with a data attribute.

A designer designates a circuit component, the name of the circuit component, the name of a state, and an attribute to be focused at a portion on a data path.

For example, the terms "facil-4", "REG", "ST-1", and "DATA" are designated in FIG. 12.

Then, the circuit component table 53 corresponding to the facil-4 is restricted. The statement correspondence tables only having a data attribute are selected in the statement correspondence tables 51a to 51c which is related to the circuit component table 53.

Then, the names of the circuit components to be connected after or before the facil-4 are extracted.

In the same diagram, the facil-1 to facil-3 and the facil-5 to facil-7 are extracted, then displayed as the source of the input of the facil-4 and the targets of the output, respectively.

Next, the designer selects one of the extracted circuit components. For example, the CONDITION and the TIMING are extracted, then displayed as shown by a character 80 in FIG. 12 from the connection nodes of facil-4 and facil-1 when the facil-1 is selected.

The displayed data means the condition when the logical product between the "A", the reversed "B" and the "IN1=A1" is satisfied.

Moreover, the data is transferred when the clock signal CLK rises as a timing condition.

The test patterns are generated by using the conditions and the timing condition described above.

The test patterns for the data input/output can be generated when a sequence of these processes is executed up to the circuit component table 53 having the input and output terminal attributes.

Similarly, test pattern generating operations for a control path and a clock path of the logical circuit can be executed.

FIG. 13 is an example of data extracted from the functional design data base 5 when the test pattern for a state transition system is generated.

Just as in the test pattern generation operation as shown in FIG. 12, the designer designates the name of a state and an attribute (STATE) to be focused. Thereby, the circuit component table 53 corresponding to the state ST-3 from the functional design data base 5 is restricted, then the statement correspondence table having the status attribute is connected to the circuit component table 53.

In addition, the names of states before and after the state ST-3 are selected. In the same diagram, "ST-1, ST-2" and "ST-4 to ST-6" are displayed as the names before and after the state "ST-3", respectively.

Next, the designer selects one of the preceding states (for example ST-1 as the preceding state ST-3). As the result, the "CONDITION" and "TIMING" are extracted from the connection nodes between the states "ST-4" and "ST-1" to generate test patterns.

Thus, the test patterns generated by the test pattern storage generating system 7 are stored in the test pattern storage portion 9.

Only the test patterns having a required attribute for a flow for state transition, a data transfer path, a control path, a clock signal path and the like can be generated by the test pattern generating system 9 as described above.

Next, a functional simulator in the test assistant system for a logical design process according to the present invention will be described.

Figure 14:
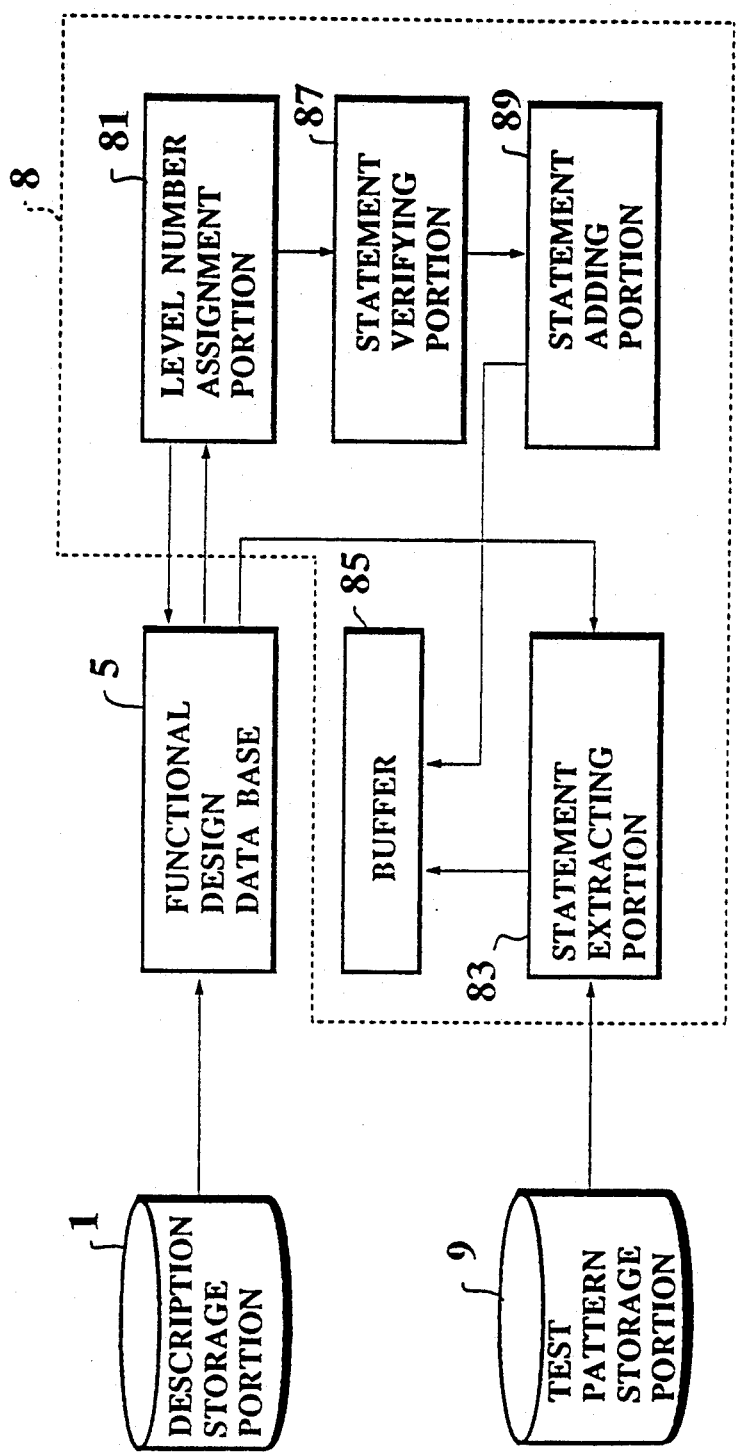
FIG. 14 is a block diagram of a configuration of a functional simulator according to the present invention.
Figure 15:
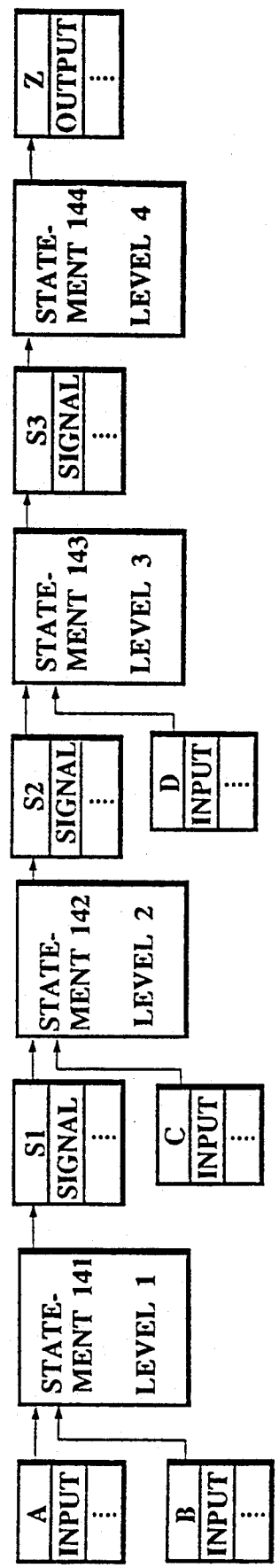
FIG. 15 is a diagram showing a level number assignment operation by the level number assignment portion shown in FIG. 14.

FIG. 14 is a block diagram of the structure of the functional simulator according to the present invention.

In the same diagram, the functional simulator comprises the description storage portion 1, the functional design data base 5, the test pattern storage portion 9 as shown in FIG. 5, and the simulator 8 which is related to the present invention.

The simulator 8 comprises a level number assignment portion 81, a statement extraction portion 83, a buffer 85, a atatement evaluating portion 87 and a statement adding portion 89.

The level number assignment portion 81 assigns a level number, which is in accordance with the number of the steps observed from the input terminal, to a statement of a hardware description provided from the functional design data base 5.

The statement extracting portion 83 extracts a statement to be evaluated by an event in test vectors provided from the test pattern storage portion 9. The buffer 85 stores the statements extracted by the statement extracting portion 83.

The statement evaluating portion 87 takes up the statement having the smallest level number stored in the buffer 85. The statement adding portion 89 adds a statement to be evaluated for an event arising from the statement evaluating portion 87.

Figure 1:
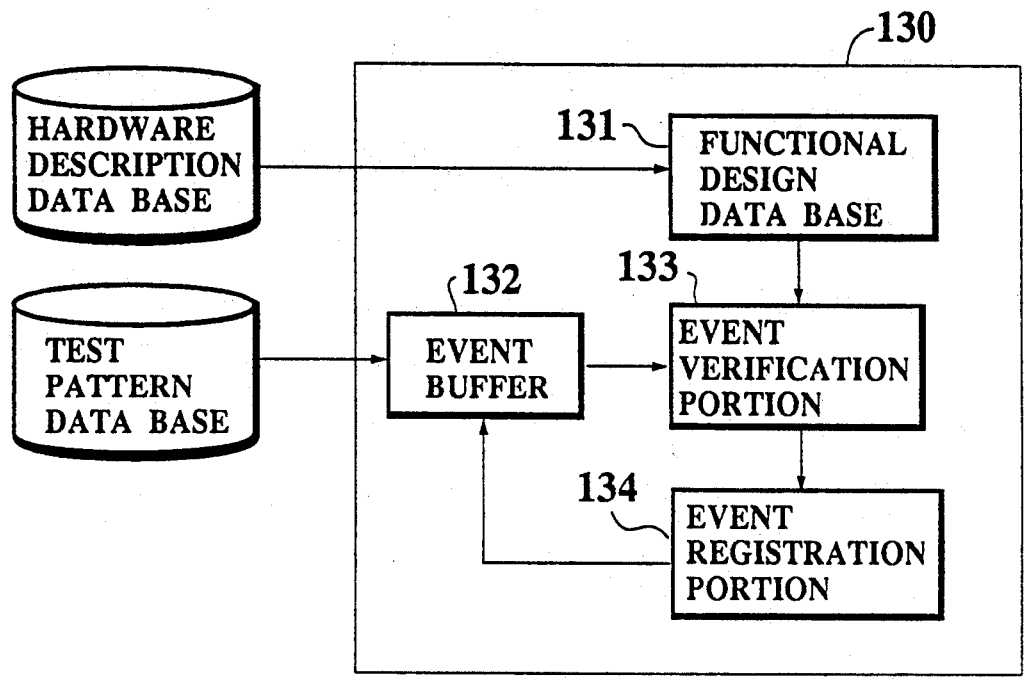
FIG. 1 is a block diagram of a conventional functional simulator.
Figure 2:
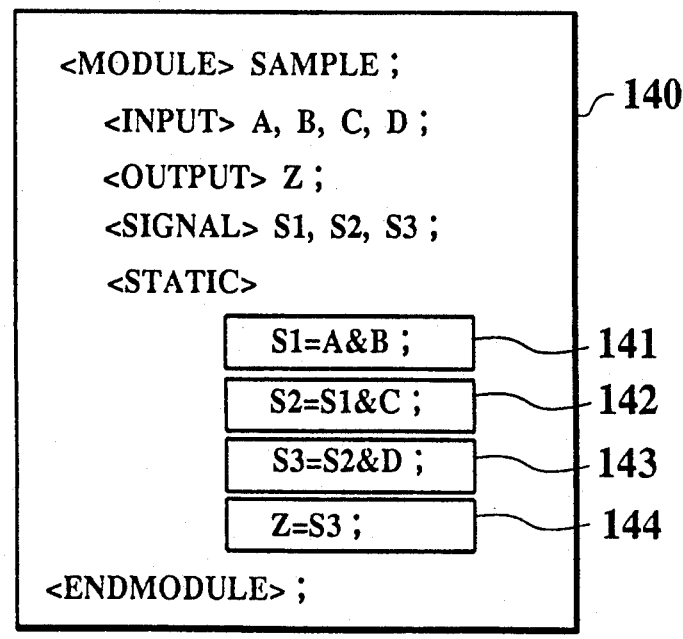
FIG. 2 is an example of a hardware description to be stored in a hardware description data base as shown in FIG. 1.

The operation of the simulator 8 will be explained for the case where the hardware description 140 as shown in FIG. 2 is provided from the functional design data base 5.

The level number assignment portion 81 reads out the statement 140, then assigns the appropriate level number, and stores it again in the functional data base 5 as shown in FIG. 5.

The level number of the statement 141 becomes "1" because all of the right portions of the statement 141 are input terminals. Although the "C" in the statement 142 is an input terminal thereof, its level number becomes "2" because the "S1" is determined by the statement of the level "1".

Similarly, the level number of the statement 143 becomes "3", and of the statement 144, "4".

Figures 3, 4:
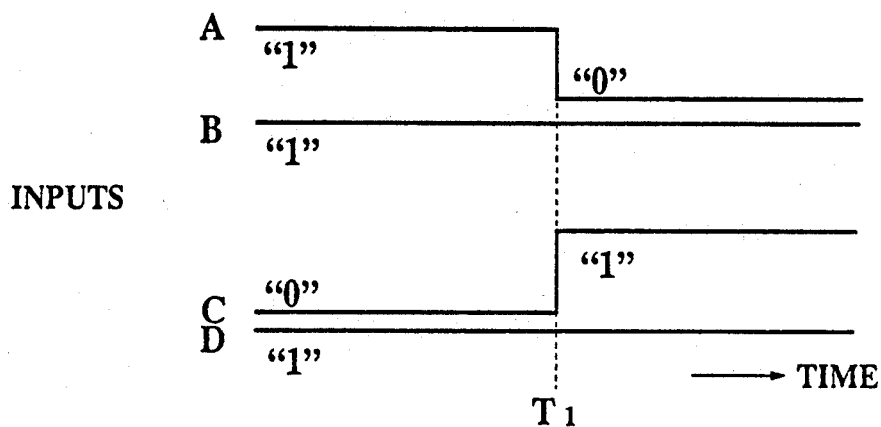
FIG. 3 is a timing chart showing a test pattern including an event.
FIG. 4 is a comparison table for explaining a comparison between the functional simulators in the prior art and the present invention.

As shown in FIG. 3, the statement extracting portion 83 stores the statements 141 and 142 to be evaluated in the buffer 85 when the level "0" is provided in the input terminal A, and the level "1" is provided to the "C" at the timing T1 (STEP 1). The statement evaluation portion 87 extracts the statement 141 having the smallest level number, then evaluates it.

As a consequence of the operations described above, the statement 142 is extracted by the statement adding portion 89 to be evaluated by the event of the state "S1" because an event has occurred in the internal signal S1, then is added to the buffer 85 (STEP 2), providing the statement 142 has been already stored in the buffer 85 so that the additional operation is not carried out.

Next, the statement adding portion 89 adds the statement 143 to be evaluated for the event of the "S2" to the buffer 85 because an event has occurred in the internal signal S2 after the statement is evaluated (STEP 3).

Similarly, the statement 143 is evaluated, then the statement 144 to be evaluated by the event of the internal signal "S2" is added to the buffer 85 (STEP 4).

Finally, the statement evaluation portion 87 extracts the statement 144 to be evaluated. Although an event has occurred in the output terminal Z by the event no statement is added to the buffer 85 (STEP 5).

Accordingly, the buffer 85 is empty so that the simulation for one vector at the timing T1 is completed.

Figure 16:
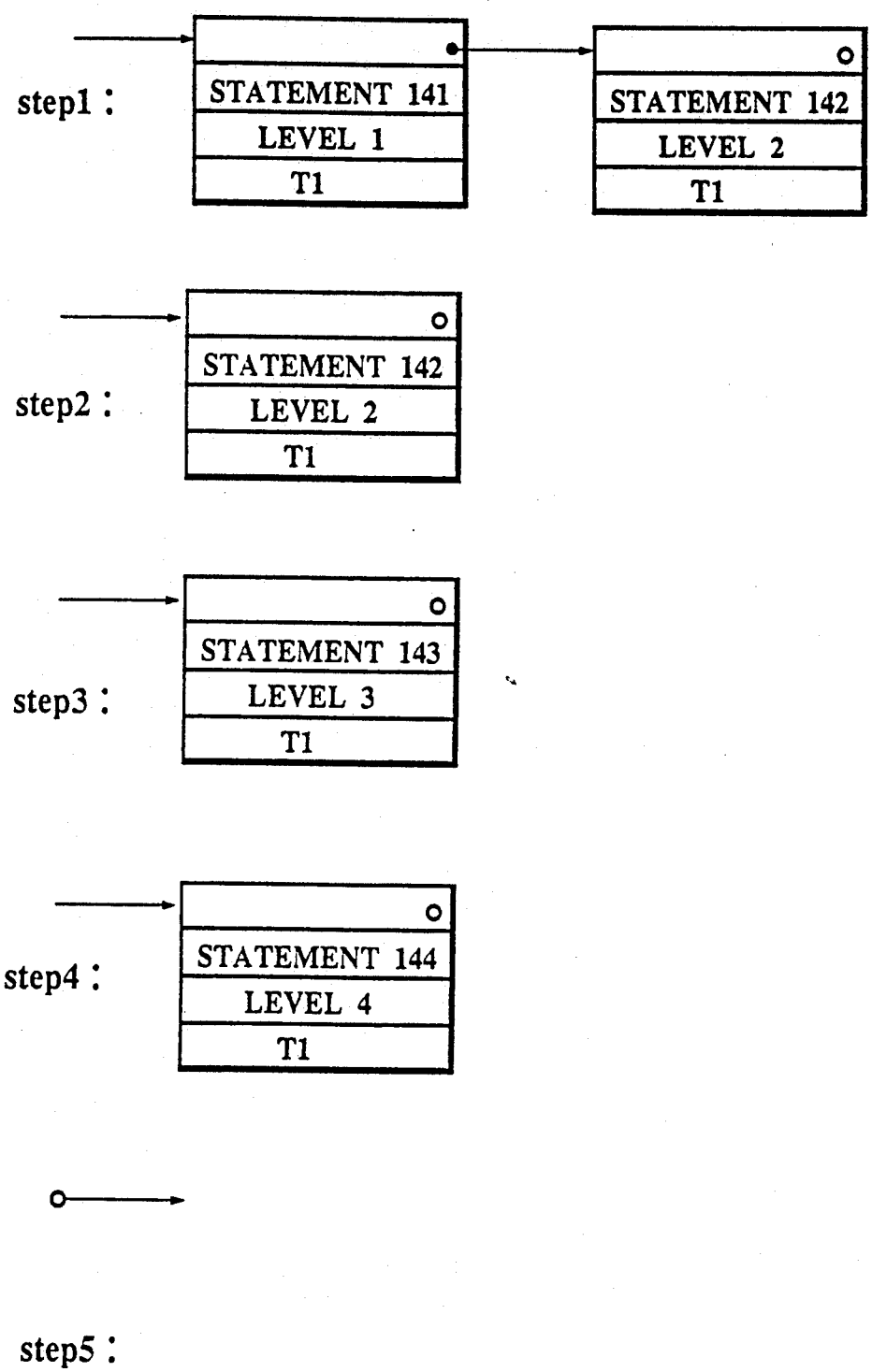
FIG. 16 is a diagram showing a change of information for a statement stored in the buffer shown in FIG. 14.

FIG. 16 is a diagram showing the change of the content of the buffer 85 in each step described above.

As clearly shown in FIG. 16, the statement numbers 141 to 144, the level numbers 1 to 4, and the timing of the event are stored in the buffer 85.

In the prior art, the conventional simulator stores statements generated at each occurrence of an event in the buffer, then evaluates all statements stored therein.

On the other hand, the simulator 8 according to the present invention evaluates only the statement in the buffer 85 to be tested, having the smallest level number corresponding to the level observed from the input terminal in the functional circuit.

Thus, statements of not use cannot be evaluated by the simulator 8 according to the present invention.

FIG. 4 is a comparison diagram of the evaluation operation for statements for both the conventional simulator and the simulator according to the present invention.

As shown in the same diagram, the conventional simulator 130 verifies the statements 142 to 144 not use.

On the other hand, the simulator 8 according to the present invention executes one evaluation operation per statement.

The information for a statement to be stored in the buffer 85 is not limited by the state number, a level number, a timing of an event. Other information for the statement can be stored in the buffer 85. However, the level number of a statement is necessary.

Moreover, the level number of each statement can be sorted ahead of time.

The test assistant system for a logical design process according to the present invention can be applied to the test pattern generating operation, simulation, and operations for the functional level design assistant system which include an operation for generating a logical gate from statements.

Various modifications will become possible for those skilled in the art after receiving the teachings of the present disclosure without departing from the scope thereof.

What is claimed is:

1. A test assistant system for a logical design process, comprising:
   description storage means for storing statements expressing RT level logical functions of circuit components to be tested;
   a compiler for compiling the statements and for outputting object data;
   a data base for storing said object data;
   test pattern generating means for generating test patterns by using said object data stored in the data base;
   test pattern storage means for storing the test patterns;
   a simulator for executing a simulation for the RT level logical function by using the test patterns stored in the test pattern storage means; and
   display means for displaying said object data, the test patterns, the information used in the simulation, and the relationships analog them;
   wherein the data base comprises a region for storing a statement correspondence table expressing statements as descriptions of the RT level logical functions of the circuit components, a region for storing a circuit component table expressing a circuit component corresponding to the function described in the statement,
   a region for storing a dependent relationship table expressing the dependent relationship between the statements, and
   a correspondence relationship table expressing the correspondence relationship between the statement correspondence table and the circuit component table, wherein the statement correspondence table includes an attribute expressing kinds of descriptions,
   the correspondence relationship table comprises a right correspondence table which expresses the content of the right portion of the statement,
   a right correspondence relationship table expressing the relationship between the right circuit components corresponding to the contents of the right portion of the statement and the right correspondence table,
   a left correspondence table which expresses the content of the left portion of the statement, and
   a left correspondence relationship table expressing the relationship between the left circuit components corresponding to the contents of the left portion of the statement and the left correspondence table.

2. A test assistant system according to claim 1, wherein the statement correspondence table includes
   a timing attribute when the kind of statement expresses a timing;
   a data attribute when the kind of statement expresses a data transfer statement;
   a condition (COND) attribute when the kind of statement expresses a condition; and
   a status attribute when the kind of statement expresses a state transition.

3. A test assistant system according to claim 2, wherein the test pattern generating means generates test patterns for the attribute of a logical function of each circuit component by using
   the statement correspondence table,
   the circuit component table,
   the dependent relationship table,
   the attribute in the statement correspondence table,
   the right expressing table and the right correspondence relationship table, and
   the left expressing table and the left correspondence table.

4. A test assistant system for a logical design process, comprising:
  description storage means for storing statements expressing RT level logical functions of circuit components to be tested;
  a compiler for compiling the statements and for outputting object data;
  a data base for storing said object data;
  test pattern generating means for generating test patterns by using said object data stored in the data base;
  test pattern storage means for storing the test patterns;
  a simulator for executing a simulation for the RT level logical function by using the test patterns stored in the test pattern storage means; and
  display means for displaying said object data, the test patterns, the information used in the simulation, and the relationships among then;
  wherein the simulator simulates the functional operations of the logical system modeled by using the descriptions as the hardware description language,
  a level number adding means for adding a level number corresponding to the step observed from the input terminal of the logical system to the statement,
  a statement extracting means for extracting the statement to be executed in accordance with the change of the test pattern provided in the input terminal,
  a extracted statement storage means for storing the statement extracted by the statement extracting means,
  a statement evaluating means for extracting the statement having the smallest level number in the extracted statement storage means, then for evaluating it, and
  a statement adding means for adding a statement to be newly executed by the change of the test pattern occurring after the evaluation of the statement by the statement evaluating means.

5. A test assistant method for a logical design process, comprising the steps of:
  a description storage step for storing statements expressing RT level logical functions of circuit components to be tested;
  a compiling step for compiling the statements to output object data;
  a step for storing said object data to a data base;
  a test pattern generating step for generating test patterns by using said object data stored in the data base;
  a test pattern storage step for storing the test patterns;
  a simulation step for executing a simulation for the RT level logical function with a simulator by using the test patterns stored in the test pattern storage means; and
  a display step for displaying said object data, the test patterns, the information used in the simulation, and relationships among them by a display means;
  wherein the data base comprises a region for storing a statement correspondence table expressing statements as descriptions of the RT level logical functions of the circuit components, a region for storing a circuit component table expressing a circuit component corresponding to the function described in the statement, a region for storing a dependent relationship table expressing the dependent relationship between the statements, and
  a correspondence relationship table expressing the correspondence relationship between the statement correspondence table and the circuit component table, wherein the statement correspondence table includes an attribute expressing kinds of descriptions,
  the correspondence relationship table comprises a right correspondence table which expresses the content of the right portion of the statement, a right correspondence relationship table expressing the relationship between the right circuit components corresponding to the contents of the right portion of the statement and the right correspondence table,
  a left correspondence table which expresses the content of the left portion of the statement, and
  a left correspondence relationship table expressing the relationship between the left circuit components corresponding to the contents of the left portion of the statement and the left correspondence table.

* * * * *